US010712371B2

(12) United States Patent
Park (10) Patent No.: US 10,712,371 B2
(45) Date of Patent: Jul. 14, 2020

(54) POWER INDUCTOR, BOARD HAVING THE SAME, AND CURRENT MEASUREMENT METHOD USING THE SAME

(71) Applicant: SAMSUNG ELECTRO-MECHANICS CO., LTD., Suwon-si, Gyeonggi-do (KR)

(72) Inventor: Sang Jin Park, Suwon-si (KR)

(73) Assignee: SAMSUNG ELECTRO-MECHANICS CO., LTD., Suwon-si, Gyeonggi-Do (KR)

(*) Notice: Subject to any disclaimer, the term of this patent is extended or adjusted under 35 U.S.C. 154(b) by 127 days.

(21) Appl. No.: 15/790,640

(22) Filed: Oct. 23, 2017

(65) Prior Publication Data

US 2018/0238936 A1 Aug. 23, 2018

(30) Foreign Application Priority Data

Feb. 22, 2017 (KR) .................. 10-2017-0023674

(51) Int. Cl.
*H01F 17/04* (2006.01)
*G01R 19/00* (2006.01)
*H01F 17/00* (2006.01)
*H01L 49/02* (2006.01)
*G01R 15/14* (2006.01)
(Continued)

(52) U.S. Cl.
CPC ......... *G01R 19/0092* (2013.01); *G01R 15/14* (2013.01); *G01R 15/181* (2013.01); *G01R 31/72* (2020.01); *H01F 17/0013* (2013.01); *H01F 17/04* (2013.01); *H01F 27/255* (2013.01); *H01F 27/292* (2013.01); *H01F 41/041* (2013.01); *H01L 28/10* (2013.01); *H01F 2003/106* (2013.01); *H01F 2017/0066* (2013.01)

(58) Field of Classification Search
CPC .. G01R 19/0092; G01R 15/181; G01R 15/14; G01R 31/06; H01F 2003/106; H01F 17/0013; H01F 17/04; H01F 17/0006; H01F 41/041; H01F 27/292; H01F 27/255; H01F 27/28; H01L 28/10
USPC .................. 336/200, 192, 182, 183, 205
See application file for complete search history.

(56) References Cited

U.S. PATENT DOCUMENTS 6,154,114 A * 11/2000 Takahashi ........... H01F 17/0013
336/200
6,218,925 B1 * 4/2001 Iwao .................... H01F 17/0013
336/200
(Continued)

FOREIGN PATENT DOCUMENTS

CN     1222745 A    7/1999
CN   102792584 A   11/2012
(Continued)

OTHER PUBLICATIONS

Korean Office Action dated Feb. 28, 2018 issued in Korean Patent Application No. 10-2017-0023674 (with English translation).
(Continued)

*Primary Examiner* — Mang Tin Bik Lian
(74) *Attorney, Agent, or Firm* — Morgan, Lewis & Bockius LLP (57) ABSTRACT

A power inductor includes: a body including a magnetic material; an internal coil disposed in the body and including a plurality of coil patterns; and a sensing coil disposed on the body and facing the internal coil.

19 Claims, 5 Drawing Sheets

(51) Int. Cl.
  *H01F 27/29* (2006.01)
  *H01F 27/255* (2006.01)
  *H01F 41/04* (2006.01)
  *G01R 15/18* (2006.01)
  *G01R 31/72* (2020.01)
  *H01F 3/10* (2006.01)

(56) References Cited

U.S. PATENT DOCUMENTS

| | | | |
|---|---|---|---|
| 2002/0097132 A1* | 7/2002 | Ahn | H01F 17/0033 336/221 |
| 2009/0008994 A1* | 1/2009 | Tonn | H01F 38/14 307/17 |
| 2011/0215893 A1* | 9/2011 | Nussbaum | H01F 19/02 336/200 |
| 2013/0057300 A1* | 3/2013 | Bernard | G01V 3/107 324/629 |
| 2013/0222101 A1* | 8/2013 | Ito | H01F 17/04 336/83 |
| 2014/0292458 A1 | 10/2014 | Andres et al. | |
| 2016/0086719 A1 | 3/2016 | Jeong | |

FOREIGN PATENT DOCUMENTS

| | | |
|---|---|---|
| CN | 104078194 A | 10/2014 |
| EP | 0 929 085 B1 | 9/2003 |
| JP | 2007-286012 A | 11/2007 |
| KR | 10-2013-0026764 A | 3/2013 |
| KR | 10-2013-0085152 A | 7/2013 |
| KR | 10-2015-0030463 A | 3/2015 |
| KR | 10-2016-0033464 A | 3/2016 |
| WO | 2011109158 A1 | 9/2011 |

OTHER PUBLICATIONS

Office Action issued in Chinese Patent Application No. 201711340015.2 dated Sep. 26, 2019, with English translation.

Second Office Action dated May 26, 2020 in Chinese Patent Application No. 201711340015.2 (with English Translation).

* cited by examiner

POWER INDUCTOR, BOARD HAVING THE SAME, AND CURRENT MEASUREMENT METHOD USING THE SAME

CROSS-REFERENCE TO RELATED APPLICATION(S)

This application claims benefit under 35 USC 119(a) of Korean Patent Application No. 10-2017-0023674 filed on Feb. 22, 2017 in the Korean Intellectual Property Office, the entire disclosure of which is incorporated herein by reference in its entirety for all purposes.

BACKGROUND

1. Field

The following description relates to a power inductor, a board having the same, and a current measurement method using the same.

2. Description of Related Art

An inductor element, an important passive element constituting an electronic circuit together with a resistor and a capacitor, is mainly used in a power supply circuit such as a direct current (DC) to DC converter in an electronic device or is widely used as a component removing noise or constituting an LC resonant circuit, and may be classified as a multilayer inductor, a winding type inductor, a thin film type inductor, and the like, depending on a manufacturing method and a structure thereof. Among these inductor elements, a power inductor serves to smooth a power circuit and remove noise.

Meanwhile, a waveform timing of a current flowing in a power inductor of the power circuit and current consumed in the power inductor may be measured in order to confirm an operation of a portable electronic device. To this end, a near magnetic field measurement method of detecting a magnetic field radiated from the power inductor may be used. However, in the magnetic field measurement method, magnetic field measurement equipment is required, and it may be difficult to accurately measure the current due to propagation loss depending on a distance between the power inductor and a probe of the magnetic field measurement equipment.

In addition, a current sensing resistor (CSR) may be additionally mounted in a power terminal in order to measure the current. However, a method using the CSR is opposed to a tendency to significantly decrease a space in which a passive element is mounted in order to miniaturize the device, and a printing circuit board for a test should thus be additionally manufactured.

SUMMARY

An aspect of the present disclosure may provide a power inductor of which a current may be measured without using magnetic field measurement equipment or a current sensing resistor, a board having the same, and a current measurement method using the same.

According to an aspect of the present disclosure, a power inductor may include: a body including a magnetic material; an internal coil disposed in the body and including a plurality of coil patterns; and a sensing coil facing the internal coil.

According to another aspect of the present disclosure, a board having a power inductor may include: a printed circuit board having first and second electrode pads disposed thereon; and a power inductor disposed on the printed circuit board, wherein the power inductor includes a body including a magnetic material, an internal coil disposed in the body and including a plurality of coil patterns, and a sensing coil facing the internal coil.

According to another aspect of the present disclosure, a current measurement method using a power inductor may include: mounting the power inductor on a printed circuit board, the power inductor including an internal coil including a plurality of coil patterns and a sensing coil facing the internal coil; applying power to the power inductor; and measuring a current induced to the sensing coil using a contact probe.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

Hereinafter, a power inductor according to an exemplary embodiment in the present disclosure will be described with reference to FIGS. 1 through 3. A thin film type power inductor is assumed and illustrated in FIGS. 1 through 3. However, the present disclosure is not limited thereto, but may be applied to a winding type power inductor and a multilayer power inductor.

Figure 1:
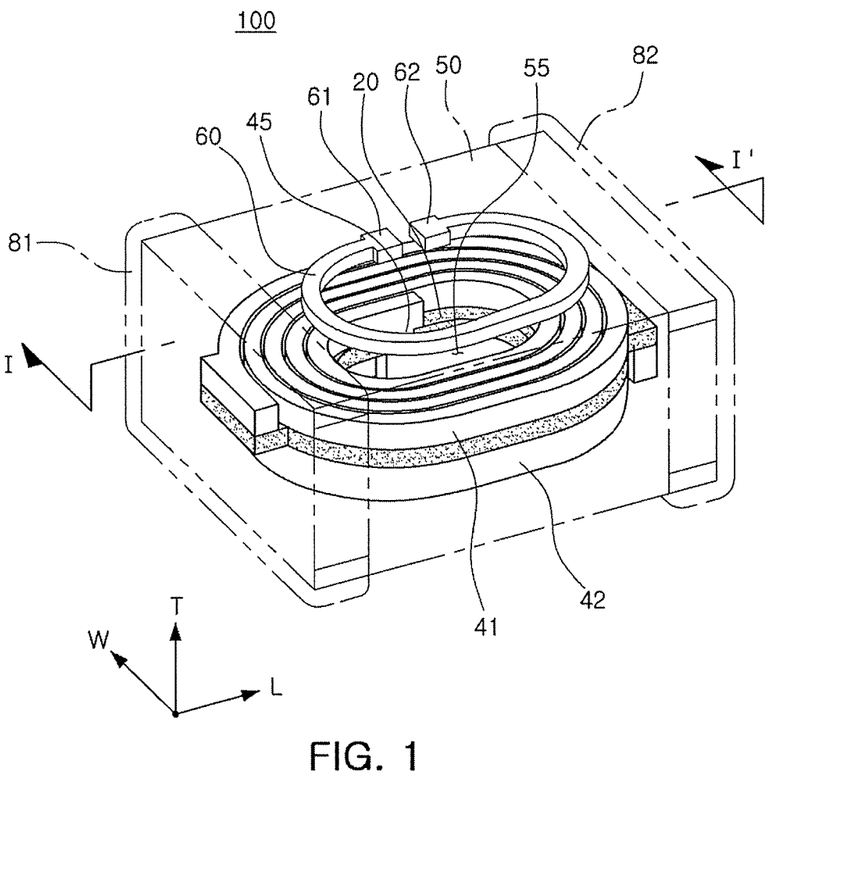
FIG. 1 shows a perspective view illustrating a power inductor according to an exemplary embodiment in the present disclosure.

FIG. 1 is a perspective view illustrating a power inductor according to an exemplary embodiment in the present disclosure.

The power inductor 100 according to the exemplary embodiment in the present disclosure may include a body 50, internal coils 41 and 42, and a sensing coil 60. In addition, the power inductor 100 may include a first external electrode 81 and a second external electrode 82 disposed on outer surfaces of the body 50 and electrically connected to the internal coils 41 and 42, respectively.

The body 50 may form an appearance of the power inductor 100, and may include a magnetic material. The magnetic material may be any material that shows a magnetic property, for example, ferrite or metal magnetic powders.

The ferrite may be, for example, Mn—Zn based ferrite, Ni—Zn based ferrite, Ni—Zn—Cu based ferrite, Mn—Mg based ferrite, Ba based ferrite, Li based ferrite, or the like.

The metal magnetic powder may include one or more selected from the group consisting of Fe, Si, Cr, Al, and Ni. For example, the metal magnetic powder may be a Fe—Si—B—Cr based amorphous metal, but is not necessarily limited thereto. In addition, the metal magnetic powders may have a particle size of 0.1 to 30 μm, and may be included in a thermosetting resin such as an epoxy resin, polyimide, or the like, in a form in which they are dispersed in the thermosetting resin.

The internal coils 41 and 42 may include a plurality of coil patterns. For example, the internal coils 41 and 42 may include a first coil pattern 41 and a second coil pattern 42 forming a coil wound in a spiral shape. In addition, the first coil pattern 41 may be formed on one surface of an insulating substrate 20 disposed in the body 50, and the second coil pattern 42 may be formed on the other surface of the insulating substrate 20 opposing one surface of the insulating substrate 20. As an example, the first coil pattern 41 and the second coil pattern 42 may be formed by performing electroplating.

The insulating substrate 20 may be, for example, a polypropylene glycol (PPG) substrate, a ferrite substrate, a metal based soft magnetic substrate, or the like. In addition, the insulating substrate 20 may have a hole formed in a central portion thereof so as to penetrate through the central portion thereof, wherein the hole may be filled with a magnetic material to form a core part 55. In a case in which the core part 55 filled with the magnetic material is formed, inductance Ls of the internal coils may be improved.

In addition, the first coil pattern 41 and the second coil pattern 42 may be formed on one surface and the other surface of the insulating substrate 20, respectively, and may be electrically connected to each other through a via 45 penetrating through the insulating substrate 20.

The sensing coil 60 may have a wound shape, be disposed on the body 50, and be disposed on the body 50 to face the internal coils 41 and 42. Here, a phrase 'disposed to face' means that an axis of a wound shape formed by the sensing coil 60 and an axis of a wound shape formed by the internal coils 41 and 42 coincide with each other or are parallel with each other in a state in which they are adjacent to each other. In addition, the internal coils 41 and 42 and the sensing coil 60 may be disposed to be spaced apart from each other by a predetermined distance.

In a case of detecting a magnetic field radiated from a power inductor several times using a near magnetic field equipment in order to measure a current of the power inductor, a deviation depending on a distance between a probe of the near magnetic field equipment and the power inductor may occur.

Since the power inductor 100 includes the internal coils 41 and 42 and the sensing coil 60 disposed to be spaced apart from each other by the predetermined distance, even in a case of measuring a current induced to the sensing coil 60 several times, a uniform measurement result may be ensured.

In addition, since the power inductor 100 includes the sensing coil 60 and the internal coils 41 and 42 disposed to face each other, the current may be induced to the sensing coil 60 by a magnetic field formed by the internal coils 41 and 42.

Further, a direction in which the sensing coil 60 and the internal coils 41 and 42 are disposed to be spaced apart from each other may be perpendicular to a direction in which a current flows in the internal coils 41 and 42, such that the current induced to the sensing coil 60 by the magnetic field formed by the internal coils 41 and 42 may be significantly increased.

In addition, both ends of the sensing coil 60 may be connected to a first sensing pad 61 and a second sensing pad 62, respectively. The first sensing pad 61 and the second sensing pad 62 may be provided in order to easily measure the current induced to the sensing coil 60. That is, the first sensing pad 61 and the second sensing pad 62 may be provided in order to be in contact with a contact probe of a current measurement equipment.

Figure 2A:
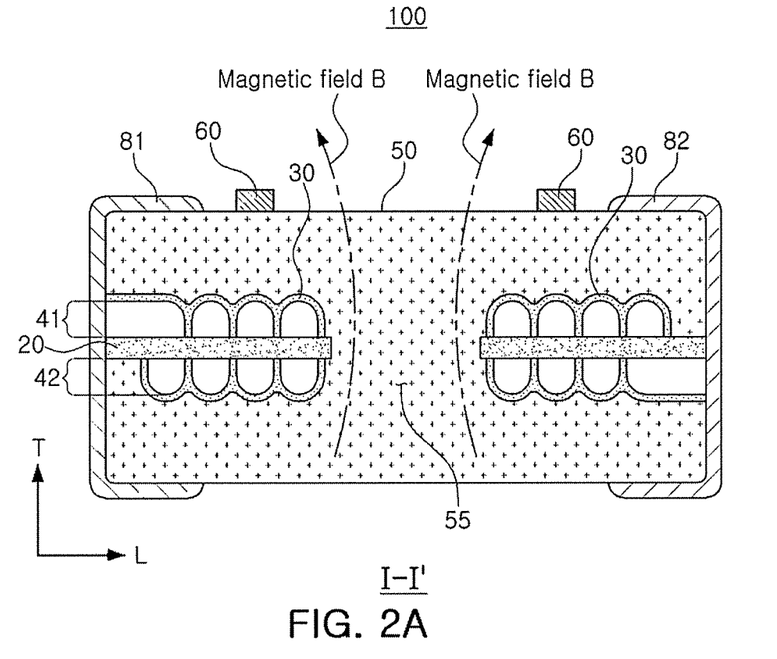
FIG. 2A shows a cross-sectional view taken along line I-I' of an embodiment of FIG. 1.
Figure 2B:
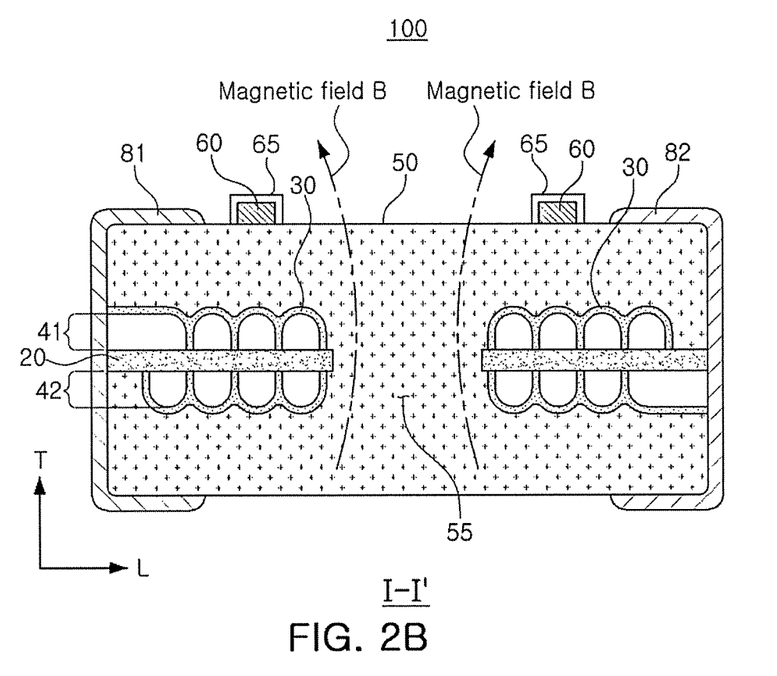
FIG. 2B shows a cross-sectional view taken along line I-I' of another embodiment of FIG. 1.

In addition, as shown in FIG. 2B, a protecting layer 65 may be disposed on a surface of the sensing coil 60. The protecting layer 65 may prevent the sensing coil 60 from being externally exposed, and may protect the sensing coil 60 from external impact. Even in a case in which the protecting layer 65 is disposed, the first sensing pad 61 and the second sensing pad 62 may be externally exposed.

Meanwhile, the internal coils 41 and 42 and the sensing coil 60 may include a metal having excellent electrical conductivity. For example, the internal coils 41 and 42 and the sensing coil 60 may be formed of silver (Ag), palladium (Pd), aluminum (Al), nickel (Ni), titanium (Ti), gold (Au), copper (Cu), platinum (Pt), or alloys thereof. The internal coils 41 and 42 and the sensing coil 60 may be made of the same material or different materials, depending on the electrical requirements.

Figure 3:
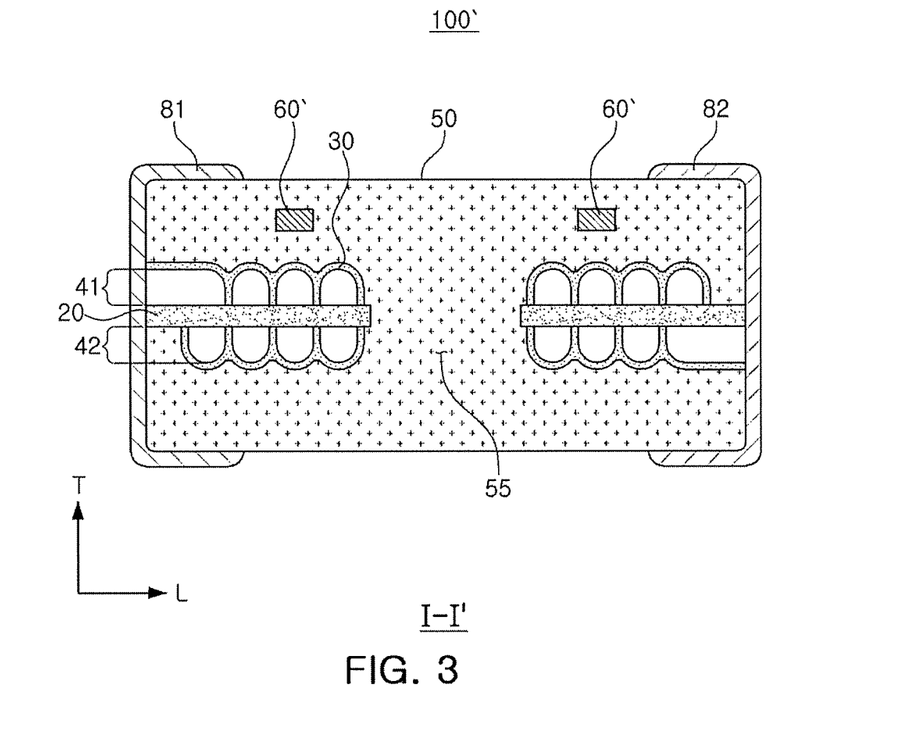
FIG. 3 shows a cross-sectional view illustrating a power inductor according to another exemplary embodiment in the present disclosure.

FIG. 2A is a cross-sectional view taken along line I-I' of FIG. 1, and FIG. 3 is a cross-sectional view illustrating a power inductor according to another exemplary embodiment in the present disclosure.

Referring to FIG. 2A, the internal coils 41 and 42 may be coated with an insulating layer 30. In detail, the insulating layer 30 may be coated on the internal coils 41 and 42 so that the internal coils 41 and 42 are not in direct contact with the magnetic material constituting the body 50.

In addition, one end portion of each of the first coil pattern 41 and the second coil pattern 42 may be exposed to at least one surface of the body 50. For example, one end portion of the first coil pattern 41 formed on one surface of the insulating substrate 20 may be exposed to one end surface of the body 50 in a length (L) direction, and one end portion of the second coil pattern 42 formed on the other surface of the insulating substrate 20 may be exposed to the other end surface of the body 50 in the length (L) direction.

In addition, the first and second external electrodes 81 and 82 may be formed on the outer surfaces of the body 50 so as to be connected, respectively, to the first coil pattern 41 and the second coil pattern 42 each exposed to the end surfaces of the body 50.

Since the sensing coil 60 is disposed to face the internal coils 41 and 42, the current may be induced by the magnetic field B formed by the internal coils 41 and 42.

The sensing coil 60 may be formed on an upper surface of the body 50. As an example, the sensing coil 60 may be formed by a method well-known in the art such as a screen printing method, an exposure and development method of a photo-resist (PR), a spray applying method, or the like.

In another exemplary embodiment in the present disclosure, a sensing coil 60' of a body 50 may be embedded in an upper portion of the body 50. Such an exemplary embodiment is illustrated in FIG. 3.

Since the power inductor 100' illustrated in FIG. 3 may be understood with reference to a description for components that are the same as or similar to the components of the power inductor 100 illustrated in FIGS. 1 and 2A except that the sensing coil 60' is embedded in the body 50, an overlapping description will be omitted.

Referring to FIG. 3, since the sensing coil 60' of the power inductor 100' is embedded in the body 50, the sensing coil 60' may be formed more adjacently to the internal coils 41 and 42. In this case, since the sensing coil 60' may more sensitively react to a magnetic field formed by the internal coils 41 and 42 and a current may be induced to the sensing coil 60', the current may be more accurately measured.

As described with reference to FIGS. 1 through 3, since the power inductor according to the exemplary embodiment in the present disclosure may include the sensing coil disposed adjacently to the internal coils and the current that is in proportion to the current flowing in the internal coils is induced to the sensing coil, the current of the power inductor may be measured from the current of the sensing coil.

Figure 4:
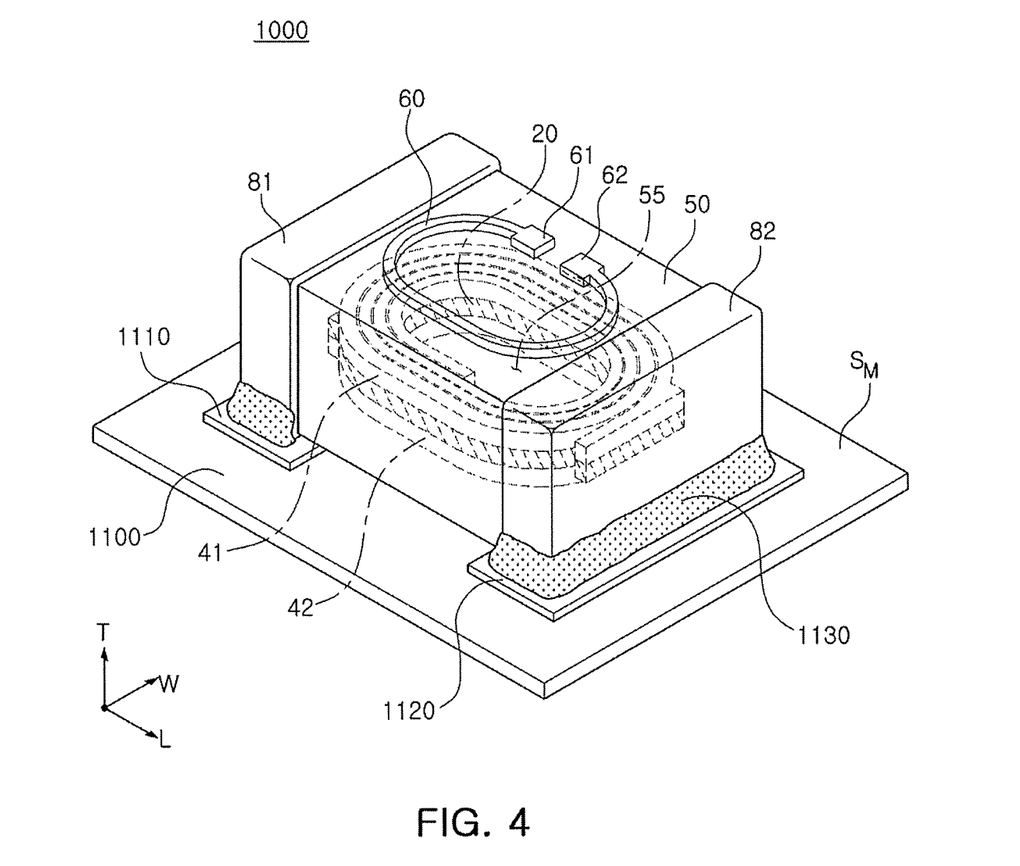
FIG. 4 shows a perspective view illustrating a form in which a power inductor is mounted on a printed circuit board according to an exemplary embodiment in the present disclosure.
Figure 5:
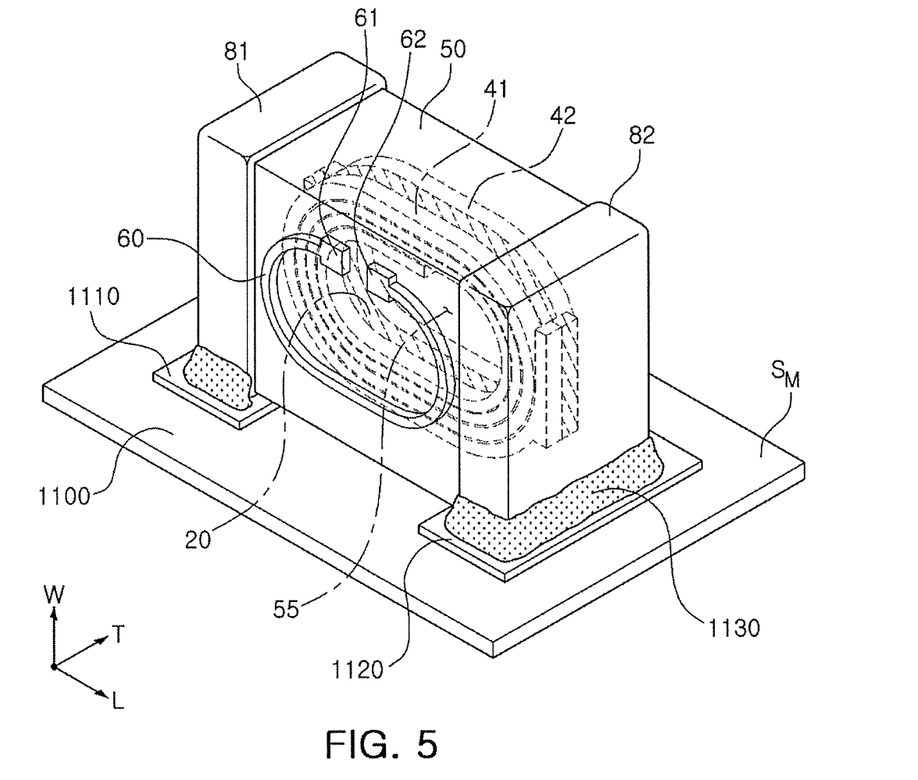
FIG. 5 shows a perspective view illustrating a form in which a power inductor is mounted on a printed circuit board according to another exemplary embodiment in the present disclosure.

FIG. 4 is a perspective view illustrating a form in which a power inductor is mounted on a printed circuit board according to an exemplary embodiment in the present disclosure, and FIG. 5 is a perspective view illustrating a form in which a power inductor is mounted on a printed circuit board according to another exemplary embodiment in the present disclosure.

Referring to FIGS. 4 and 5, the power inductor may include the power inductor illustrated in FIGS. 1 and 2A. However, the power inductor is not limited thereto, but may be the power inductor illustrated in FIG. 3.

A board 1000 having a power inductor according to an exemplary embodiment in the present disclosure may include a printed circuit board 1100 on which the power inductor 100 is mounted and first and second electrode pads 1110 and 1120 formed on an upper surface of the printed circuit board 1100 so as to be spaced apart from each other. The first and second electrode pads 1110 and 1120 may be land patterns connected to circuit patterns implemented on the printed circuit board 1100 and provided in order to mount the power inductor.

Here, the power inductor may be electrically connected to the printed circuit board 1100 by solders 1130 in a state in which the first and second external electrodes 81 and 82 formed on both end surfaces of the power inductor are positioned on the first and second electrode pads 1110 and 1120, respectively, so as to in contact with the first and second electrode pads 1110 and 1120, respectively.

As illustrated in FIG. 4, the internal coils 41 and 42 of the power inductor mounted on the printed circuit board may be disposed parallel to a mounting surface $S_M$ of the printed circuit board 1100.

As another exemplary embodiment in the present disclosure, referring to FIG. 5, in a board 1000' having a power inductor, internal coils 41 and 42 of a power inductor mounted on the printed circuit board may be disposed perpendicularly to a mounting surface SM of the printed circuit board 1100.

A description overlapping with the features of the power inductor described above with reference to FIGS. 1 through 3 except for the description described above will be omitted.

Figure 6:
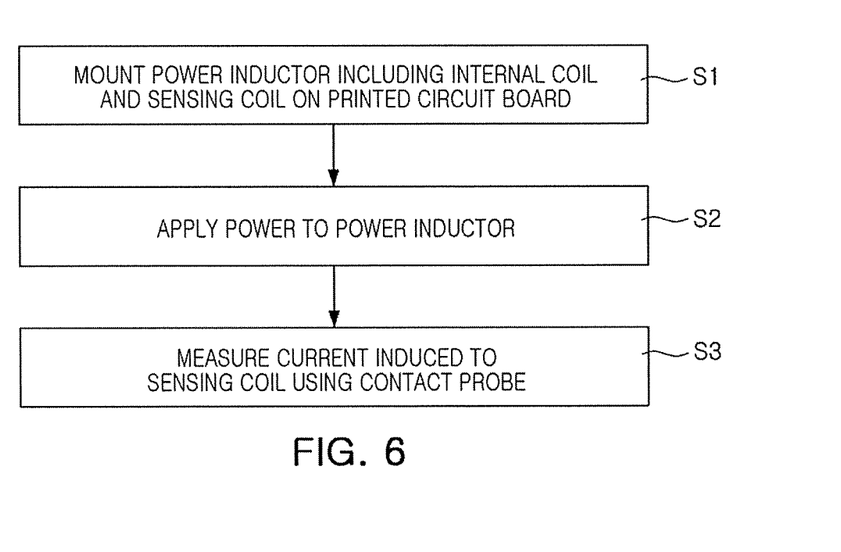
FIG. 6 shows a flow chart illustrating a current measurement method using a power inductor according to an exemplary embodiment in the present disclosure.

FIG. 6 is a flow chart illustrating a current measurement method using a power inductor according to an exemplary embodiment in the present disclosure.

The current measurement method using a power inductor according to the exemplary embodiment in the present disclosure may include mounting the power inductor on the printed circuit board (S1), the power inductor including the internal coils including the plurality of coil patterns and the sensing coil facing the internal coils; applying power to the power inductor (S2); and measuring the current induced to the sensing coil using the contact probe (S3).

Referring to FIGS. 4 and 6, an integrated circuit (IC), or the like, for controlling an operation of an electronic device may be formed on the printed circuit board 1100. In addition, a current may be applied from a power circuit for providing power to the integrated circuit (IC) to the integrated circuit (IC).

In order to measure such a current, the power inductor according to the exemplary embodiment in the present disclosure may be mounted on the printed circuit board (S1), the power circuit may be driven to apply the power to the power inductor (S2), and the contact probe may be in contact with the sensing pads 61 and 62 of the power inductor to measure the current induced to the sensing coil 60 (S3). Since the current flowing in the sensing coil 60 is induced by the magnetic field formed by the current flowing in the internal coils of the power inductor, the current flowing in the power inductor may be measured from the current flowing in the sensing coil 60.

As set forth above, in the power inductor and the board having the same according to the exemplary embodiment in the present disclosure, the current of the power inductor may be measured using the sensing coil disposed adjacently to the internal coil.

In addition, in the current measurement method using a power inductor according to the exemplary embodiment in the present disclosure, the current may be accurately measured without requiring a special equipment or a separate printed circuit board for a test.

While exemplary embodiments have been shown and described above, it will be apparent to those skilled in the art that modifications and variations could be made without departing from the scope of the present invention as defined by the appended claims.

What is claimed is:

1. A power inductor comprising:
    a body including a magnetic material;
    an internal coil disposed in the body and including a plurality of coil patterns stacked in a thickness direction of the body;
    a sensing coil facing the internal coil; and
    a first sensing pad and a second sensing pad connected to both ends of the sensing coil, respectively, and adapted to be in contact with a contact probe of a current measurement equipment,
    wherein the sensing coil has an innermost side surface which is radially outward of an innermost side surface of the internal coil,
    wherein the internal coil and the sensing coil are disposed such that an uppermost portion of the internal coil and a lowermost portion of the sensing coil are spaced apart from each other by a predetermined distance in the thickness direction, and
    wherein the first and second sensing pads each have a width greater than the sensing coil.

2. The power inductor of claim 1, wherein the sensing coil is embedded in an upper portion of the body.

3. The power inductor of claim 1, wherein the sensing coil is disposed on a surface of the body.

4. The power inductor of claim 3, further comprising a protecting layer disposed on a surface of the sensing coil.

5. The power inductor of claim 1, further comprising a wherein the first sensing pad and the second sensing pad connected to both ends of the sensing coil, respectively, and are exposed to an upper surface of the body.

6. The power inductor of claim 1, wherein a direction in which a current flows in the internal coil is perpendicular to a direction in which the internal coil and the sensing coil are disposed to be spaced apart from each other.

7. The power inductor of claim 1, wherein a current is induced to the sensing coil by a magnetic field formed by the internal coil.

8. A board having a power inductor, comprising:
a printed circuit board having first and second electrode pads disposed thereon; and
a power inductor disposed on the printed circuit board,
wherein the power inductor includes a body including a magnetic material, an internal coil disposed in the body and including a plurality of coil patterns stacked in a thickness direction of the body, a sensing coil facing the internal coil, and a first sensing pad and a second sensing pad connected to both ends of the sensing coil, respectively, and adapted to be in contact with a contact probe of a current measurement equipment,
wherein the sensing coil has an innermost side surface which is radially outward of an innermost side surface of the internal coil,
wherein the internal coil and the sensing coil are disposed such that an uppermost portion of the internal coil and a lowermost portion of the sensing coil are spaced apart from each other by a predetermined distance in the thickness direction, and
wherein the first and second sensing pads each have a width greater than the sensing coil.

9. The board having a power inductor of claim 8, wherein the internal coil is disposed parallel to a mounting surface of the printed circuit board.

10. The board having a power inductor of claim 8, wherein the internal coil is disposed perpendicularly to a mounting surface of the printed circuit board.

11. The board having a power inductor of claim 8, wherein the sensing coil is embedded in an upper portion of the body.

12. The board having a power inductor of claim wherein the sensing coil is disposed on a surface of the body.

13. The board having a power inductor of claim 8, further comprising a wherein the first sensing pad and the second sensing pad connected to both ends of the sensing coil, respectively, and are exposed to an upper surface of the body.

14. The board having a power inductor of claim 8, wherein a direction in which a current flows in the internal coil is perpendicular to a direction in which the internal coil and the sensing coil are disposed to be spaced apart from each other.

15. The board having a power inductor of claim 8, wherein a current is induced to the sensing coil by a magnetic field formed by the internal coil.

16. A current measurement method using a power inductor, comprising:
mounting the power inductor on a printed circuit board, the power inductor comprising an internal coil including a plurality of coil patterns stacked in a thickness direction of the power inductor, a sensing coil facing the internal coil, and a first sensing pad and a second sensing pad connected to both ends of the sensing coil, respectively, and adapted to be in contact with a contact probe of a current measurement equipment, wherein the sensing coil has an innermost side surface which is radially outward of an innermost side surface of the internal coil;
applying power to the power inductor; and
measuring a current induced to the sensing coil using the contact probe,
wherein the internal coil and the sensing coil are disposed such that an uppermost portion of the internal coil and a lowermost portion of the sensing coil are spaced apart from each other by a predetermined distance in the thickness direction.

17. The current measurement method of claim 16, wherein a direction in which a current flows in the internal coil is perpendicular to a direction in which the internal coil and the sensing coil are disposed to be spaced apart from each other.

18. The current measurement method of claim 16, wherein a current is induced to the sensing coil by a magnetic field formed by the internal coil to which the power is applied.

19. A power inductor comprising:
a body including a magnetic material;
an internal coil disposed in the body and including a plurality of coil patterns;
a sensing coil facing the internal coil in a direction of the body corresponding to a smallest dimension thereof; and
a first sensing pad and a second sensing pad connected to both ends of the sensing coil, respectively, and adapted to be in contact with a contact probe of a current measurement equipment,
wherein the first and second sensing pads each have a width greater than the sensing coil.

* * * * *